United States Patent [19]
Teoh et al.

[11] Patent Number: 6,116,822
[45] Date of Patent: Sep. 12, 2000

[54] MOVABLE ABUTMENT FOR A COMPONENT FEEDER

[75] Inventors: Ping Chow Teoh, Kedah; Ka Tiek Lim, Penang, both of Malaysia

[73] Assignee: Motorola, Inc., Schaumburg, Ill.

[21] Appl. No.: 09/127,940

[22] Filed: Aug. 3, 1998

[51] Int. Cl.[7] .................................................. B65G 51/30
[52] U.S. Cl. ............................ 406/180; 406/85; 406/93; 406/112; 406/122; 406/137; 198/468.2
[58] Field of Search .................................. 406/10, 12, 28, 406/29, 31, 83, 85, 93, 107, 108, 112, 119, 122, 137, 176, 180, 194; 198/468.2, 468.4, 426, 428, 429, 430

[56] References Cited

U.S. PATENT DOCUMENTS

| | | | |
|---|---|---|---|
| 1,553,476 | 9/1925 | Schuster | 406/93 |
| 4,084,769 | 4/1978 | Tyler | 406/108 |
| 4,189,260 | 2/1980 | Morano et al. | 406/112 |
| 4,801,044 | 1/1989 | Kubota et al. | 406/137 |
| 5,570,812 | 11/1996 | Ando et al. | 406/107 |
| 6,024,208 | 2/2000 | Chooi et al. | 406/83 |
| 6,039,512 | 3/2000 | Chooi et al. | 406/85 |

*Primary Examiner*—Christopher P. Ellis
*Assistant Examiner*—Joe Dillon, Jr.
*Attorney, Agent, or Firm*—Dale W. Dorinski

[57] ABSTRACT

A feeder (1) has a hopper (2) for storing components (20) and a pick up location (3) for supplying the components to a pick-and-place machine (not shown). A channel (4) provides communication between the hopper (2) and pick up location (3). The channel (4) has an upwardly inclined portion (5) which is upwardly inclined towards the pick up location (3) and there are controlled air jet nozzles (14,6) for providing pulsed air jets to push the components (20) up the inclined portion (5) and towards the pick up location (3). The pick up location (3) has a movable stopper (30) that moves to a feed position when one of the components (20) is fed to the pick up location 3, and that moves to a pick position, prior to the pick and place machine picking up the component (20) at the pick location (3).

17 Claims, 3 Drawing Sheets

MOVABLE ABUTMENT FOR A COMPONENT FEEDER

FIELD OF THE INVENTION

This invention relates to a movable abutment and more particularly a movable abutment for a feeder for surface mountable components.

BACKGROUND OF THE INVENTION

Component feeding is a well-known process in surface mount technology. In general, a feeder is used to sequentially supply surface mountable electrical components to a pick up location for subsequent placing, by a pick-and-place machine, onto a printed circuit board (PCB) which is pre-printed with solder paste.

Hopper feeders also known as bulk or tube feeders are an alternative to tape and reel feeders. Hopper feeders comprise a hopper in communication, along a downwardly sloping passage, with the pick up location. The downwardly sloping passage makes use of gravity for supplying the components to the pick up location. To further assist the supplying of the components to the pick up location a combination of gravity and air blasting has also been used.

The pick up location has an abutment wall and an aperture. The abutment wall abuts the components supplied from the hopper before they are removed, through the aperture, by the pick-and-place machine. The supply of components to the pick up location must be controlled, otherwise undesirable amounts of friction between the abutment wall and an abutting component can result. This friction is due to a mass of stacked components in the downwardly sloping passage pushing the abutting components into the abutment wall. Accordingly, this friction may cause problems when the pick-and-place machine attempts to remove the abutting component. Further, unnecessary friction between the abutting component and an adjacent component can further hinder the removal of the abutting component.

In order to reduce the friction described above, the supply of components to the pick up location is mechanically controlled to separate components in the downwardly sloping passage from a component in the pick up location. For example, one conventional approach is to use a pneumatically controlled slotted disk located horizontally in series between the pick up location and sloping passage. The slotted disk has two diametrically opposite slots for sequentially engaging a component. The disk rotates through 180 degrees in a timed sequence to thereby transport an individual component, engaged in one of the slots, from the passage to the pick up location.

The above conventional mechanically controlled component separation approach requires valuable limited space. This is primarily due to the disk being substantially larger than the components and for practical reasons it is located horizontally therefore increasing the width of the feeder.

Another method of separating the components is to shape the slope to have an upwardly sloping portion which causes some of the components in the stack of components to slide downwards due to gravity. This separation between the components in the stack reduces the friction between components at the pick up location. However, the friction between a component and the abutment wall, still significantly affects the ability of the pick and place machine to remove the component at the pick up location.

BRIEF SUMMARY OF THE INVENTION

The present invention therefore seeks to provide a movable abutment which overcomes, or at least reduces the above-mentioned problems of the prior art.

Accordingly, in one aspect, the invention provides a feeder comprising: at least one component store comprising: an outlet; a component pick up location comprising: an inlet; a component pick up aperture; a component channel comprising: an upwardly inclined portion which is upwardly inclined towards the component pick up location; an inlet coupled to the outlet of the at least one component store; and an outlet coupled to the inlet of the component pick up location; a component agitator associated with the at least one component store; and a movable component abutment associated with the component pick up location that is movable between a component feeding position and a component picking position.

In another aspect, the invention provides a feeder for supplying electrical components to pick-and-place machine, the feeder comprising: at least one storage means for storing some of said components; a pick up location for supplying said components to said pick-and-place machine; a channel providing communication between said storage means and said pick up location, said channel comprising an upwardly inclined portion which is upwardly inclined towards said pick up location; agitation means associated with said storage means, said agitation means providing for agitation of said components in said storage means to thereby align and transfer at least some of said components into said channel; and a movable abutment means associated with said pick up location, wherein in a first position said movable abutment means abuts at least one of said components at the pick up location, and wherein in a second position said movable abutment means does not abut said components at said pick up location.

BRIEF DESCRIPTION OF THE DRAWINGS

An embodiment of the invention will now be more fully described, by way of example, with reference to the drawings of which.

DETAILED DESCRIPTION OF THE DRAWINGS

Figure 1:
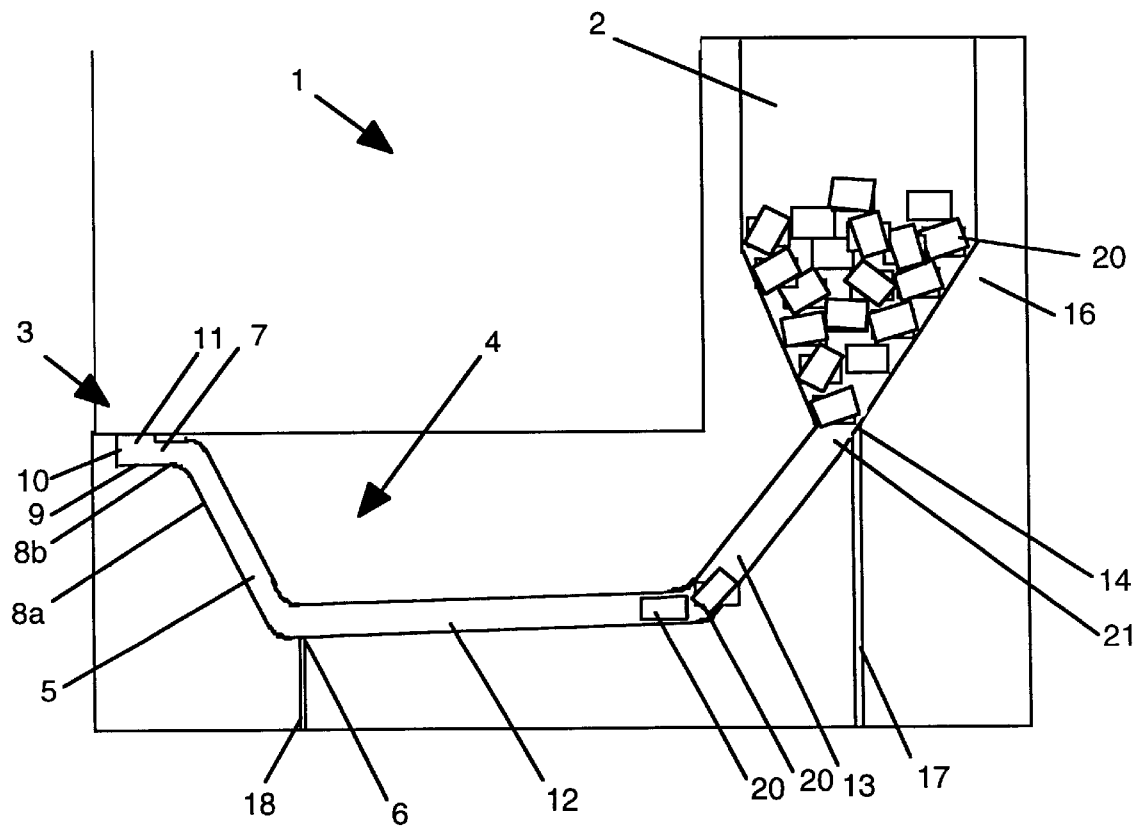
FIG. 1 is a side sectional view of a preferred embodiment of a feeder having a stopper in accordance with the present invention.
Figure 2:
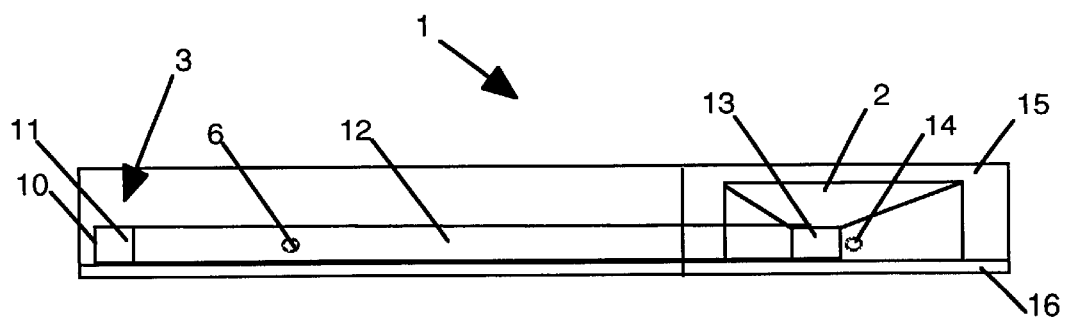
FIG. 2 is a plan view of the feeder in FIG. 1.
Figure 3:
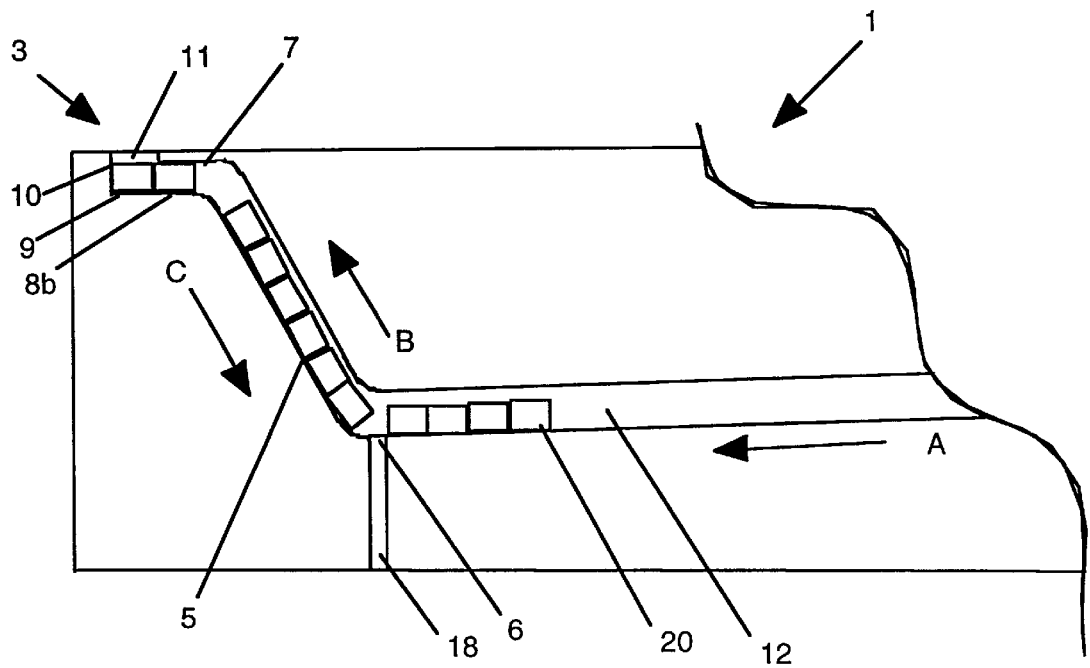
FIG. 3 is a side sectional view of the feeder in FIG. 1 in operation.

FIGS. 1 to 3 illustrates a feeder 1 for supplying electrical components to a pick-and-place machine 9 (not shown). The feeder 1 includes a component store means in the form of a hopper 2, a pick up location 3 and a channel 4. The channel 4 provides communication between the hopper 2 and the pick up location 3 so that electrical components 20 in the hopper 2 can be transferred to the pick up location 3.

The channel 4 has an upwardly inclined portion 5 that is upwardly inclined towards the pick up location 3. There is a fluid stopping means in the form of an air jet nozzle 6 located in a first portion 12. The channel 4 has an intermediate portion 7 between the pick up location 3 and the upwardly inclined portion 5. The intermediate portion 7 has a component supporting surface 8b in a horizontal plane. Accordingly, the component supporting surface 8b is angled relative to a component supporting surface 8a of the upwardly inclined portion 5.

The pick up location 3 has a component supporting surface 9 that is aligned with surface 8b. There is also a movable stopper 30 (not shown) having an abutment wall 10 for stopping and positioning the components 20 and an access aperture 11 for allowing removal of the components 20, by the pick-and-place machine, from the pick up location 3.

Figure 4:
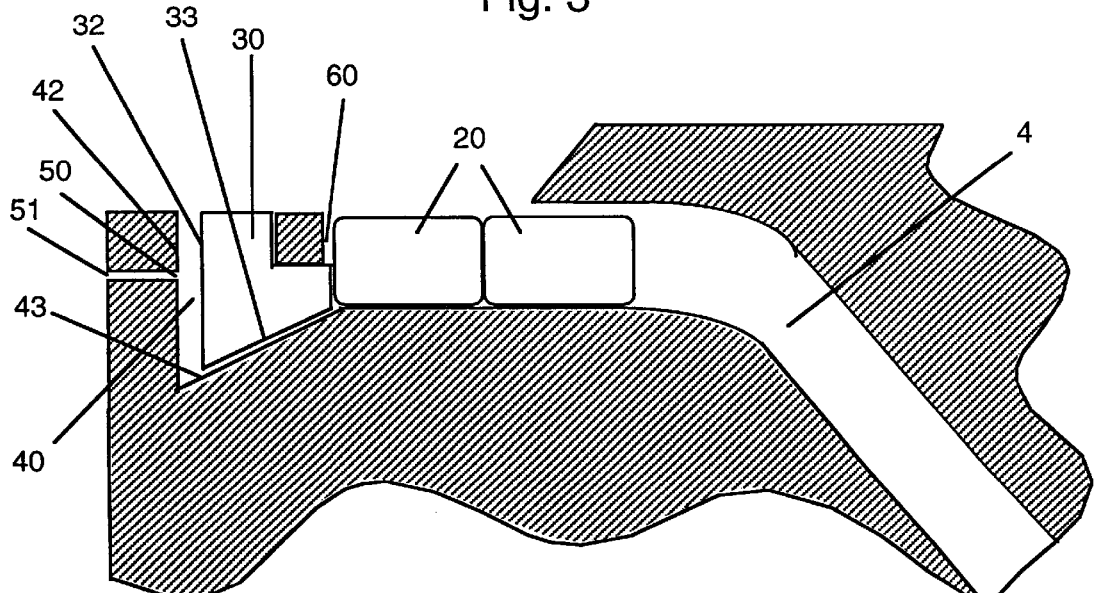
FIG. 4 is an enlarged sectional view of the stopper in FIG. 1 in a feed position.
Figure 5:
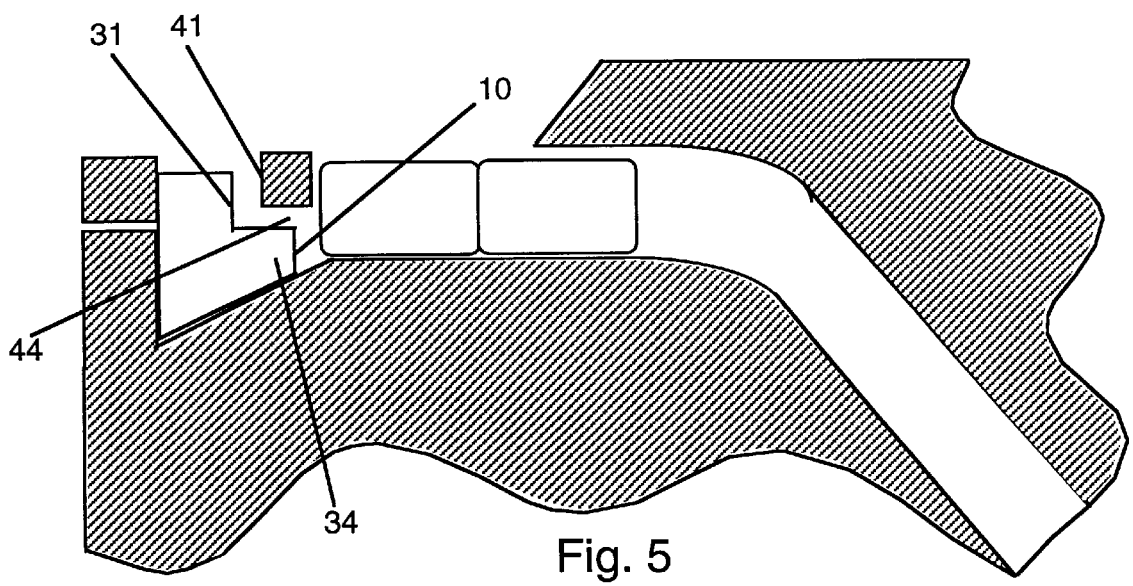
FIG. 5 is an enlarged sectional view of the stopper in FIG. 1 in a pick position.

With reference now to FIGS. 4 and 5, the movable stopper 30 moves within a stopper chamber 40. The movable stopper 30 has: a front abutting surface 31 for abutting a front wall 41 of the stopper chamber 40; a rear abutting surface 32 for abutting a rear wall 42 of the stopper chamber 40; and an inclined lower surface 33 for sliding on an inclined floor 43 of the stopper chamber 40. The movable stopper 30 also has a protruding portion 34 at an end of which is the abutment wall 10. In addition, when the movable stopper is in a feeding position, the protruding portion 34 extends through an opening 44 of the stopper chamber 40.

There is an air jet nozzle 50 located in the rear wall 42 of the stopper chamber 40. An air conduit 51 allows for air to be supplied to nozzle 50 for moving the movable stopper 30 from a picking position to the feeding position. In the feeding position, air is supplied via the conduit 51 to nozzle 50 and the movable stopper 30 is pushed away from nozzle 50. The movable stopper 30 slides on the inclined floor 43 and the protruding portion 44 passes through the opening 44 of the stopper chamber. The movable stopper continues moving until the front abutting surface 31 abuts the front wall 41. The movable stopper 30 is now in the feeding position, as is shown in FIG. 4, and will remain in this position as long as air supplied to the conduit 51.

When the air supply to the conduit 51 is stopped or substantially reduced, the movable stopper 30 slides down the inclined floor 43, due to the effects of gravity, retracting the protruding portion 44 until the rear abutting surface 32 abuts the rear wall 42. The movable stopper 30 is now in the picking position, as is shown in FIG. 5, and will remain in this position until air is supplied to the conduit 51 once again.

With additional reference now to FIGS. 1 to 3, the channel 4 also has a first portion 12 and second portion 13 angled relative to each other. The second portion 13 is coupled at one end to an outlet 21 of the hopper 2 and at the other end to an end of the first portion 12. The other end of the first portion 12 is coupled to an end of the upwardly inclined portion 5 and the first portion 12 is angled relative to the upwardly inclined portion 5.

There is a combined agitator and fluid pushing means in the form of an air jet nozzle 14 located in hopper 2, adjacent the outlet 21, for agitating the components 20 in the hopper 2; and another air jet nozzle 6 located in the first portion 12, adjacent the end coupled to the upwardly inclined portion 5, for pushing the components 20 up the upwardly inclined portion 5 towards the pick up location 3. An air conduit 17 allows for air to be supplied to nozzle 14 and another air conduit 18 allows for air to be supplied to nozzle 6.

The channel 4, pick up location 3, hopper 2 and air conduits 17, 18 are machined into a surface of a block 15 and enclosed by a transparent plate 16 that is glued and bolted to the block 15 (bolts not shown).

In use, the conduits 17,18 and 51 are operatively coupled to a controlled pulsed compressed air supply (not shown). The air supply provides air to nozzle 50 which moves the movable stopper 30 into the feeding position, the air supply then provides a blast of air through nozzle 14 to agitate the components 20 in hopper 2. Accordingly, after each air blast through nozzle 14 one or more components 20 may drop through the outlet 21 into the second portion 13. The components 20 in the second portion 13 will usually slide in the direction of arrow A into the first portion 12 and form a queue.

If there is available space in the upwardly inclined portion 5, a subsequent air blast through nozzle 14 will push the components 20 in the portions 13 or 14 up the upwardly inclined portion 5 (in the direction of arrow B). Further, if there is available space, a leading one of the components 20 in the queue will be pushed into the intermediate portion 7. However, if there is no available space in the intermediate portion 7, upon completion of an air blast the components 20 will slide down the inclined portion 5 in the direction of arrow C due to the effects of gravity. To prevent the components located in the inclined portion 5 from sliding back down into the first portion 12, air is supplied through nozzle 6 at intervals between the air blasts through nozzle 14.

When there is no component located in pick up location 3, the next air blast will push the leading one of the components 20 into location 3. The leading component will abut the abutment wall 10 of the movable stopper 30, and will be positioned underneath the access aperture 11 ready for removal by a pick and place machine. Further, if there is a component 20 located in the intermediate portion 7, this component will push against the leading component, pressing the leading component against the abutment wall 10.

The air supply then stops providing air to the conduit 51 and the movable stopper 30 moves from the feeding position to the picking position. The lead component advantageously does not abut the abutment wall 10 as there is now a pressure relief gap between the abutment wall 10 and the leading edge of the leading component. The leading component is now ready for removal by a pick-and-place machine. Typically, a robot arm (not shown) can remove the components in the pick location 3 via the access apertures 11. The robot arm then places the component onto required positions on a printed circuit board (PCB) or substrate.

The present invention as described above advantageously limits the amount of friction of components against an abutment wall at a pick up location without the need for slotted disks and the like.

Although this invention has been described with reference to a preferred embodiment, it is to be understood that the invention is not limited to the specific embodiment described herein.

We claim:

1. A feeder comprising:
   at least one component store comprising:
      an outlet;
   a component pick up location comprising:
      an inlet;
      a component pick up aperture;
   a component channel comprising:
      an upwardly inclined portion which is upwardly inclined towards the component pick up location;
      an inlet coupled to the outlet of the at least one component store; and
      an outlet coupled to the inlet of the component pick up location;
   a component agitator proximate to the at least one component store; and
   a slidable component abutment associated with the component pick up location that is movable between a component feeding position and a component picking position.

2. A feeder in accordance with claim 1, wherein the at least one component store comprises at least one component storage means for storing some components;

wherein the component pick up location comprises a component pick up location means for supplying the components to a pick-and-place machine;

wherein the component channel comprises a component channel means for communicating the components between the component storage means and the component pick up location means;

wherein the component agitator comprises a component agitator means for agitation of the components in the component storage means to thereby align and transfer at least some of the components into the component channel means; and wherein the movable component abutment comprises a movable abutment means for positioning at the component feeding position when the components are being fed to the pick up location means, and for positioning at the component picking position when at least one of the components at the pick up location means is ready for picking through the component pick up aperture.

3. A feeder for supplying electrical components to a pick-and-place machine, the feeder comprising:

at least one storage means for storing some of said components;

a pick up location for supplying said components to said pick-and-place machine;

a channel providing communication between said storage means and said pick up location, said channel comprising an upwardly inclined portion which is upwardly inclined towards said pick up location;

agitation means associated with said storage means, said agitation means providing for agitation of said components in said storage means to thereby align and transfer at least some of said components into said channel; and a slidable abutment means associated with said pick up location,
wherein in a first position said slidable abutment means abuts at least one of said components at the pick up location, and
wherein in a second position said movable abutment means does not abut said components at said pick up location.

4. A feeder as claimed in claim 3, wherein said movable abutment means comprises at least one abutment surface for abutting at least one surface of said components.

5. A feeder as claimed in claim 3, wherein said movable abutment means further comprises guide means for guiding movement of the movable abutment means between said first and said second positions.

6. A feeder as claimed in claim 5, wherein said movable abutment means further comprises biasing means for biasing the movable abutment means to at least one of the first and second positions.

7. A feeder as claimed in claim 6 wherein said biasing means comprises:

said abutment means having a first inclined surface; and said guide means having a second inclined surface which complements the first inclined surface, wherein the first inclined surface abuts the second inclined surface, wherein the first and second inclined surfaces form an acute angle to a horizontal plane, and wherein gravitational force biases the movable abutment means.

8. A feeder as claimed in claim 3, wherein said channel includes a first portion providing communication between said storage means and upwardly inclined portion, and wherein a length of said first portion is angled relative to said upwardly inclined portion.

9. A feeder as claimed in claim 8, wherein there is a fluid stopping means for stopping at least some of said components from sliding out of said upwardly inclined portion and into said first portion.

10. A feeder as claimed in claim 9, wherein said fluid stopping means, a fluid pushing means for pushing said components up said upwardly inclined portion, and a fluid moving means for moving said movable abutment means, each comprise at least one air jet outlet operatively coupled to a compressed air supply, and wherein said air supply is controllable to selectively supply air to at least one of said air jet outlets.

11. A feeder as claimed in claim 3, wherein there is an intermediate portion of said channel between said pick up location and said upwardly inclined portion.

12. A feeder as claimed in claim 11, wherein said intermediate portion has a component supporting surface angled relative to a component supporting surface of said upwardly inclined portion.

13. A feeder as claimed in claim 12, wherein said component supporting surface of said intermediate portion is substantially aligned in a horizontal plane.

14. A feeder as claimed in claim 3, further comprising a fluid moving means for moving said movable abutment means.

15. A feeder as claimed in claim 8, wherein the fluid moving means comprises at least one air jet outlet arranged to provide air to move the movable abutment means.

16. A feeder as claimed in claim 15, wherein the fluid moving means further comprises a compressed air supply coupled to the at least one air jet outlet, wherein said compressed air supply is controllable to selectively supply air to the at least one air jet outlet.

17. A feeder as claimed in claim 16, wherein the fluid moving means is integrally formed therein to the feeder.

* * * * *